(12) United States Patent
Kwon et al.

(10) Patent No.: US 10,366,644 B2
(45) Date of Patent: Jul. 30, 2019

(54) DISPLAY PANEL AND METHOD OF FORMING LIGHTING TEST LINE OF THE SAME

(71) Applicant: SAMSUNG DISPLAY CO., LTD., Yongin-si, Gyeonggi-do (KR)

(72) Inventors: Sun-Ja Kwon, Gunpo-si (KR); Won-Kyu Kwak, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 65 days.

(21) Appl. No.: 15/230,998

(22) Filed: Aug. 8, 2016

(65) Prior Publication Data
US 2017/0069239 A1 Mar. 9, 2017

(30) Foreign Application Priority Data
Sep. 8, 2015 (KR) .................. 10-2015-0126761

(51) Int. Cl.
G02F 1/1333 (2006.01)
G09G 3/00 (2006.01)
G01R 31/26 (2014.01)
H01L 27/12 (2006.01)
G01R 31/44 (2006.01)

(52) U.S. Cl.
CPC ......... G09G 3/006 (2013.01); G01R 31/2644 (2013.01); G01R 31/44 (2013.01); H01L 27/124 (2013.01); H01L 27/1259 (2013.01); G09G 2300/0426 (2013.01); G09G 2330/12 (2013.01)

(58) Field of Classification Search
CPC ............ G02F 1/136204; G02F 1/1345; G02F 1/1309; G02F 1/136259; G09G 3/006; G09G 2300/0426; G09G 2300/12; G01R 31/2644; G01R 31/44; H01L 27/124; H01L 27/1259
USPC ......................................... 349/40
See application file for complete search history.

(56) References Cited

U.S. PATENT DOCUMENTS

| | | | | |
|---|---|---|---|---|
| 2009/0296011 A1* | 12/2009 | Yoon | ............ | G02F 1/1362 349/40 |
| 2015/0144915 A1* | 5/2015 | Lee | ............ | G02F 1/1309 257/40 |
| 2016/0026053 A1* | 1/2016 | Kawamura | ............ | G02F 1/1309 257/48 |

FOREIGN PATENT DOCUMENTS

| | | |
|---|---|---|
| KR | 100475639 B1 | 2/2005 |
| KR | 101113476 B1 | 1/2012 |
| KR | 101300914 B1 | 8/2013 |
| KR | 1020140131774 A | 11/2014 |

* cited by examiner

*Primary Examiner* — Nathanael R Briggs
*Assistant Examiner* — William D Peterson
(74) *Attorney, Agent, or Firm* — Cantor Colburn LLP (57) ABSTRACT

A display panel includes a display region including a data line and a pixel that is electrically connected to the data line, a non-display region including a lighting test line that is arranged alternately in a first layer and in a second layer disposed on the first layer, the non-display region being adjacent to the display region and including, and a lighting test unit providing a lighting test voltage to the display region through the lighting test line.

19 Claims, 5 Drawing Sheets

DISPLAY PANEL AND METHOD OF FORMING LIGHTING TEST LINE OF THE SAME

This application claims priority to Korean Patent Application No. 10-2015-0126761, filed on Sep. 8, 2015, and all the benefits accruing therefrom under 35 U.S.C. § 119, the content of which in its entirety is herein incorporated by reference.

BACKGROUND

1. Field

Exemplary embodiments relate to a display device. More particularly, exemplary embodiments of the invention relate to a display panel that includes a lighting test line for detecting an internal crack and a method of forming the lighting test line of the display panel.

2. Description of the Related Art

According to a lighting test, a test voltage is supplied to a display panel and an internal crack of the display panel is detected based on a light emission state (e.g., color, luminance, etc.) of a pixel included in the display panel, where the light emission state is determined based on the test voltage. However, the lighting test detects a crack only on the pixel and a line electrically connected to the pixel. That is, it is difficult for the lighting test to detect a crack on a substrate.

Recently, a display panel, which includes a test line arranged along an edge of the display panel (or, a region in which a pixel is not disposed) to perform a lighting test for detecting a crack on the substrate of the display panel based on a resistance change of the test line, is proposed.

SUMMARY

A new crack due to a large antenna ratio of the test line may occur in the display panel. Here, the antenna ratio is defined as a ratio of a total area of an oxide gate of a test transistor electrically connected to the test line to an area of the test line electrically connected to the gate oxide (i.e., the test line acting as an antenna). The antenna ratio is used as an indicator to predict (or, estimate) a damage due to instantaneous discharges of electric charges stored in the test line (or, between the test lines) under a certain condition during a plasma etching process of the display panel.

Exemplary embodiments provide a display panel having a reduced antenna ratio of a lighting test line.

Exemplary embodiments provide a method of forming a lighting test line of a display panel.

According to exemplary embodiments, a display panel may include a display region including a data line and a pixel that is electrically connected to the data line, a non-display region including a lighting test line that is alternately in a first layer and in a second layer disposed on the first layer, the non-display region being adjacent to the display region, and a lighting test unit providing a lighting test voltage to the display region through the lighting test line.

In exemplary embodiments, the lighting test line may include N test lines disposed in the first layer, where N is an integer greater than or equal to 2, and N−1 bridges disposed in the second layer. Here, an (i)th bridge among the N−1 bridges may electrically connect an (i)th test line and an (i+1)th test line among the N test lines, where i is a positive integer smaller than N.

In exemplary embodiments, the display region may include an insulating interlayer disposed between the first layer and the second layer.

In exemplary embodiments, the (i)th bridge may be electrically connected to the (i)th test line and the (i+1)th test line through a contact hole defined in the insulating interlayer.

In exemplary embodiments, the lighting test unit may include a test transistor including a first electrode that receives the lighting test voltage, a second electrode that is electrically connected to the lighting test line, and a gate electrode that receives a lighting test control signal, where the gate electrode of the test transistor is disposed in the first layer, and where the first electrode and the second electrode of the test transistor are disposed in the second layer.

In exemplary embodiments, each of the N test lines may include a material which is the same as a material of the gate electrode of the test transistor.

In exemplary embodiments, each of the N−1 bridges may include a material which is the same as a material of the first electrode of the test transistor.

In exemplary embodiments, the (i)th bridge may be adjacent to the second electrode of the test transistor.

In exemplary embodiments, the (i)th bridge may be adjacent to the data line.

In exemplary embodiments, the lighting test line may include a first test line disposed in the first layer, a first connecting line disposed in the second layer, and a first contact electrically connecting the first test line and the first connecting line.

In exemplary embodiments, the lighting test unit may include a test transistor including a first electrode that receives the lighting test voltage, a second electrode that is electrically connected to the lighting test line, and a gate electrode that receives a lighting test control signal, where the gate electrode of the test transistor is disposed in the first layer, and where the first electrode and the second electrode of the test transistor are disposed in the second layer.

In exemplary embodiments, the first connecting line may include a material which is the same as a material of the first electrode of the test transistor.

In exemplary embodiments, the first contact may include a material which is different from a material of the first electrode of the test transistor.

In exemplary embodiments, the non-display region may include an insulating interlayer disposed between the first layer and the second layer.

In exemplary embodiments, the first contact electrically may connect the first test line and the first connecting line through a contact hole defined in the insulating interlayer.

In exemplary embodiments, the pixel may emit green color light in response to the lighting test voltage.

In exemplary embodiments, the data line may extend in a first direction and the data line is disposed in an edge of the display region in a second direction, where the second direction is perpendicular to the first direction.

In exemplary embodiments, the display panel may include a pad unit electrically connected to a driving integrated circuit and a switching unit electrically connected between the pad unit and the data line, the switching unit receiving a reference voltage from the driving integrated circuit to transfer the reference voltage to the data line.

In exemplary embodiments, the driving integrated circuit controls the lighting test unit and the switching unit to alternatively provide the lighting test voltage and the reference voltage to the data line.

According to exemplary embodiments, a method of forming a lighting test line of a display panel including a substrate includes patterning a test line on the substrate, forming an insulating interlayer to cover the substrate and the test line, defining a contact hole in the insulating interlayer, and forming a bridge on the insulating interlayer, the bridge being electrically connected to the test line through the contact hole.

Therefore, a display panel according to exemplary embodiments may have a reduced antenna ratio of a lighting test line in a manufacturing process of the display panel by including the lighting test line which is alternately in a first layer and a second layer, where a portion of the lighting test line is provided in the second layer after the other portion of the lighting test line is provided in the first layer. As a result, a damage of the display panel due to the antenna ratio of the lighting test line may be reduced.

In addition, a method of forming a lighting test line according to exemplary embodiments may efficiently form the lighting test line of the display panel.

BRIEF DESCRIPTION OF THE DRAWINGS

Illustrative, non-limiting exemplary embodiments will be more clearly understood from the following detailed description taken in conjunction with the accompanying drawings, in which.

DESCRIPTION

Hereinafter, the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1:
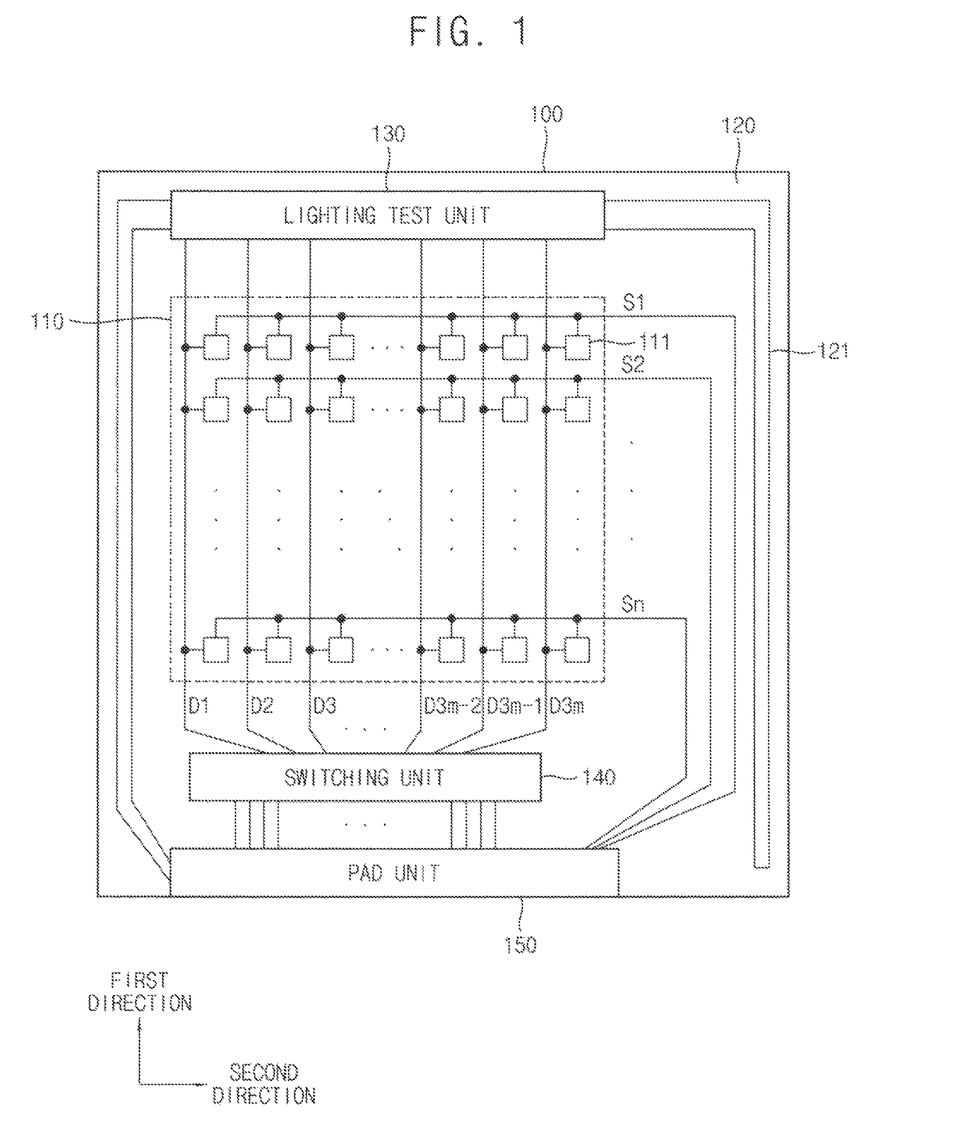
FIG. 1 is a diagram illustrating exemplary embodiments of a display panel according to the invention.

FIG. 1 is a diagram illustrating a display panel according to exemplary embodiments.

Referring to FIG. 1, the display panel 100 may include a display region 110, a non-display region 120, a lighting test unit 130, a switching unit 140, and a pad unit 150. The display region 110, the non-display region 120, the lighting test unit 130, the switching unit 140, and the pad unit 150 may be disposed on a substrate.

The display region 110 may include data lines D1 through D3$m$ and pixel 111, where m is an integer greater than or equal to 2. Each of the data lines D1 through D3$m$ may extend in a first direction and may be spaced apart from each other along a second direction. Here, the second direction may be parallel to a top surface of the display panel 100 (or, the substrate) and may be perpendicular to the first direction. The pixel 111 may be electrically connected to the data lines D1 through D3$m$. The pixel 111 may emit light in response to a lighting test signal provided through the data lines D1 through D3$m$.

In addition, the display region 110 may include scan lines S1 through Sn, where n is an integer greater than or equal to 2. Each of the scan lines S1 through Sn may extend in the second direction and may be spaced apart from each other along the first direction. Here, the pixel 111 may be disposed in cross-regions of the data lines D1 through D3$m$ and the scan lines S1 through Sn. The pixel 111 may store the lighting test signal in response to a scan signal and may emit light based on the lighting test signal. In an exemplary embodiment, the scan signal may be provided from an external component (e.g., a driving integrated circuit) through the scan lines S1 through Sn, for example.

The non-display region 120 may be adjacent to the display region 110 and may include a lighting test line 121 which is arranged (or, disposed) along an edge (or, a border, an outer area) of the display region 110. The non-display region 120 may include a remaining area of the display panel 100 except an area in which the display region 110 is disposed.

The lighting test line 121 may electrically connect the lighting test unit 130 and one among the data lines D1 through D3$m$. The lighting test line 121 may transfer a lighting test voltage (or, lighting test signal) from the lighting test unit 130 to one among the data lines D1 through D3$m$. The lighting test line 121 may include resistance, and the resistance may be changed due to a damage (or, a crack) which occurs in the non-display region 120. Therefore, a method of lighting test of the display panel 100 may detect the crack which occurs in the non-display region 120 based on a change of resistance of the lighting test line 121.

In exemplary embodiments, the lighting test line 121 may be alternatively arranged (or, disposed) in a first layer and in a second layer. Here, the first layer may be disposed on the substrate, and the second layer may be disposed above the first layer. That is, the lighting test line 121 may arranged via two layers.

The lighting test line 121 may be provided through a plurality of processes. In an exemplary embodiment, a first lighting test line (i.e., a portion of the lighting test line 121) disposed in the first layer may be provided during a first process, and a second lighting test line (i.e., a remaining portion of the lighting test line 121) disposed in the second layer may be provided during a second process and may be electrically connected to the first lighting test line, for example. In an exemplary embodiment, the first lighting test line may be provided when a gate electrode of a transistor included in the display panel 100, and the second lighting test line is provided when a source electrode (or, a drain electrode) of the transistor is provided, for example.

Because the lighting test line 121 is sequentially (or, partially) provided through the plurality of processes, an antenna effect (or, an antenna ratio) of the lighting test line 121 may be reduced at a certain time (e.g., during a plasma etching process). That is, a length of the lighting test line 121 may be reduced as the lighting test line 121 is partially provided. Therefore, the antenna effect (or, the antenna ratio) of the lighting test line 121 may be reduced.

A structure of the lighting test line 121 will be described in detail with reference to FIGS. 3 and 4, and a method of forming the lighting test line 121 will be described in detail with reference to FIGS. 5 through 8.

The lighting test unit 130 may transfer the lighting test voltage to the display region 110 (i.e., the data lines D1 through D3$m$ or the pixel 111). Here, the lighting test voltage may be provided through the pad unit 150 (or, from an external component) for lighting test. The lighting test unit 130 may transfer the lighting test voltage to one among the data lines D1 through D3$m$ through the lighting test line 121.

The switching unit 140 may be electrically connected between the data lines D1 through D3$m$ and the pad unit 150. The switching unit 140 may transfer a reference voltage to the display region 110 through the pad unit 150 (or, from a driving integrated circuit), where the reference voltage may be 0 volt (V).

The pad unit 150 may include pads. Even though it is not illustrated in FIG. 1, first pads may be electrically connected to the lighting test unit 130 and may transfer the lighting test voltage and a lighting test control signal that are provided from an external component (e.g., the driving integrated circuit). Second pads may be electrically connected to the switching unit 140 and may transfer the reference voltage and a switching control signal that are provided from the external component (e.g., the driving integrated circuit). Here, the driving integrated circuit may generate the lighting test control signal and the switching control signal and may control the lighting test unit 130 and the switching unit 140 to alternatively provide the lighting test voltage and the reference voltage to the display unit 110 (or, to the data lines D1 through D3$m$) using the lighting test control signal and the switching control signal.

As described above, the display panel 100 according to exemplary embodiments may include the lighting test line 121 which is alternatively disposed in the first layer and in the second layer, and the lighting test line 121 may be partially provided at a certain manufacturing process of the display panel 100 according to a structure of the lighting test line 121. Therefore, the antenna effect (or, the antenna ratio) may be reduced, and a damage (or, a crack) of the display panel 100 due to the antenna effect of the lighting test line 121 may be reduced.

Figure 2:
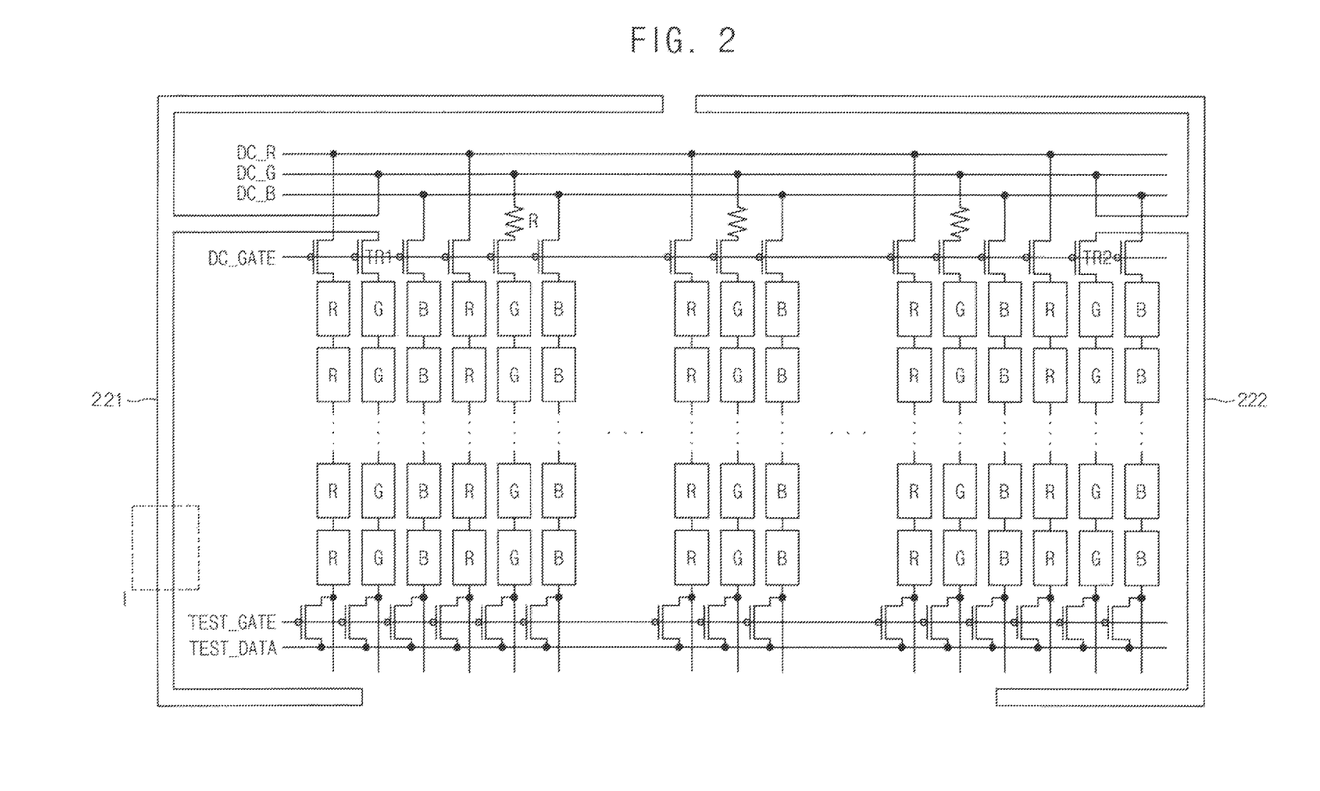
FIG. 2 is a diagram illustrating an example of the display panel of FIG. 1.

FIG. 2 is a diagram illustrating an exemplary embodiment of the display panel of FIG. 1.

Referring to FIGS. 1 and 2, the display panel 100 may include a first lighting test line 221 and a second lighting test line 222. As illustrated in FIG. 2, the first lighting test line 221 and the second lighting test line 222 may be arranged (or, disposed) along an edge of the display panel 100. The display panel 100 may include the first and second lighting test lines 221 and 222 illustrated in FIG. 2, the display panel 100 is not limited thereto. In an exemplary embodiment, the display panel 100 may include a lighting test line routing (or, surrounding) the non-display region 120, for example. In an exemplary embodiment, the non-display region 120 may be divided into three or more areas, and the display panel 100 may include three or more lighting test lines which are respectively disposed in the areas, for example.

The display region 110 may include pixel columns that are electrically connected to the data lines D1 through D3m, respectively. In an exemplary embodiment, each of the pixel columns may include a red pixel R, a green pixel G, and a blue pixel B, respectively, for example. Here, the red pixel R may emit light with red color, the green pixel G may emit light with green color, and the blue pixel B may emit light with blue color. In this case, the first lighting test line 221 and the second lighting test line 222 may be electrically connected to a green pixel column (i.e., a pixel column including the green pixel G). Because a green color has higher visibility than other colors (i.e., a red color, or a blue color), a change of resistance of the first lighting test line 221 may be detected more easily. In addition, the green pixel column (or, a data line electrically connected to the green pixel column) may be arranged in an edge (or, a border, an outer area) of the display region 110 (or, adjacent to an edge of the display region 110).

The lighting test unit 130 may include power lines and test transistors TR1 and TR2 that are electrically connected between the power lines and the pixel columns. The power lines may transfer lighting test voltages DC_R, DC_G, and DC_B for the pixels (i.e., the red pixel R, the green pixel G, and the blue pixel B). The test transistors TR1 and TR2 may be turned on in response to a lighting test control signal DC_GATE and may transfer the lighting test voltages DC_R, DC_G, and DC_B to the pixel columns.

The first test transistor TR1 may be electrically connected to a pixel column through the first lighting test line 221, and the second test transistor TR2 may be electrically connected to a pixel column through the second lighting test line 222. A remain of transistors except the first and second test transistors TR1 and TR2 may be electrically connected to a pixel column through a resistor R. Here, the resistor R may have resistance which is the same as resistance of the first lighting test line 221 (or, the second lighting test line 222).

In exemplary embodiments, the first test transistor TR1 may include a first electrode that receives the lighting test voltage (e.g., DC_G), a second electrode that is electrically connected to the first lighting test line 221, and a gate electrode that receives the lighting test control signal DC_GATE. That is, the first test transistor TR1 may transfer the lighting test voltage (e.g., DC_G) to the first lighting test line 221 in response to the lighting test control signal DC_GATE.

The switching unit 140 may include a reference voltage line and switching transistors. The reference voltage line may transfer a reference voltage. The reference voltage may be provided from an external component (e.g., a driving integrated circuit). It is illustrated that the switching unit 140 may include the reference voltage line that is different from (or, independent from) the data lines D1 through D3m in FIG. 2. However, the switching unit 140 is not limited thereto. In an exemplary embodiment, the switching unit 140 may use the data lines D1 through D3m as the reference voltage line, for example.

In exemplary embodiments, each of switching transistors of the switching unit 140 may include a first electrode that is electrically connected to a pixel column (or, a data line), a second electrode that receives a test data TEST_DATA (e.g., reference voltage), and a gate electrode that receives a switching control signal TEST_GATE. That is, each of the switching transistors may transfer the reference voltage to the pixel column (or, the data line) in response to the switching control signal TEST_GATE.

According to a method of lighting-testing of the display panel 100, the lighting test voltage (e.g., DC_G) and the reference voltage may be alternately provided to the pixel column. That is, the method may generate a lighting test signal, which has a square waveform (e.g., an alternating current waveform), based on the lighting test voltage and the reference voltage and may provide the lighting test signal to the pixel column. When resistance of the lighting test line (e.g., the first lighting test line 221 or the second lighting test line 222) is increased due to a crack of the display panel 100, the lighting test signal, which is transferred through the lighting test line, may be delayed. Here, pixels (i.e., pixels electrically connected to the lighting test line) may emit light with different color from other pixels in response to a delayed lighting test signal. Therefore, the crack of the display panel 100 may be detected.

Figure 3:
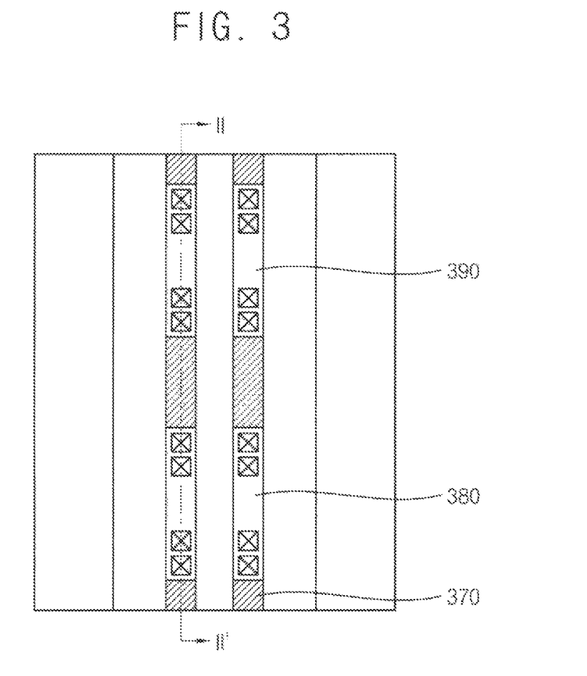
FIG. 3 is a diagram illustrating an example of a lighting test line included in the display panel of FIG. 2.

FIG. 3 is a diagram illustrating an example of a lighting test line included in the display panel of FIG. 2. FIG. 4 is a cross-sectional view of the lighting test line of FIG. 3.

Figure 4:
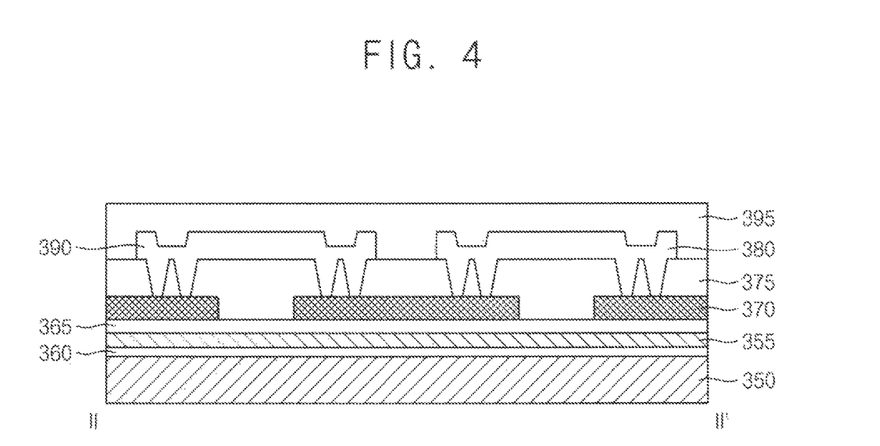
FIG. 4 is a cross-sectional view of the lighting test line of FIG. 3.
Figure 5:
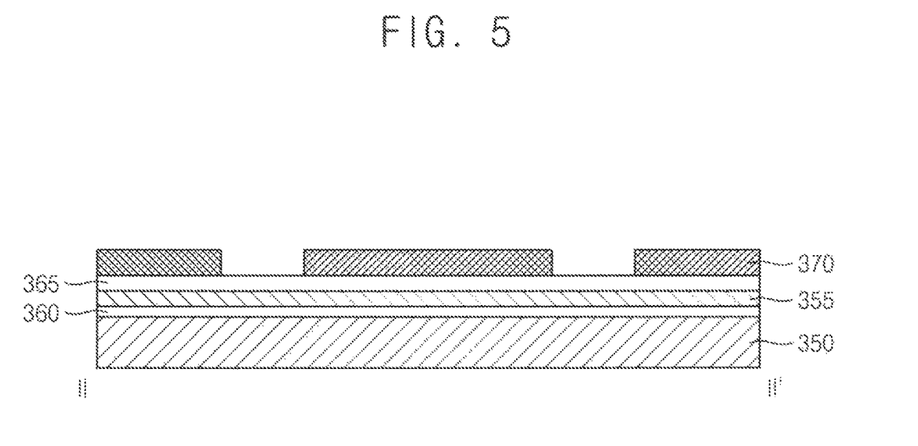
FIGS. 5 through 8 are cross-sectional views for describing exemplary embodiments of a method of forming a lighting test line of a display panel according to the invention.
Figure 6:
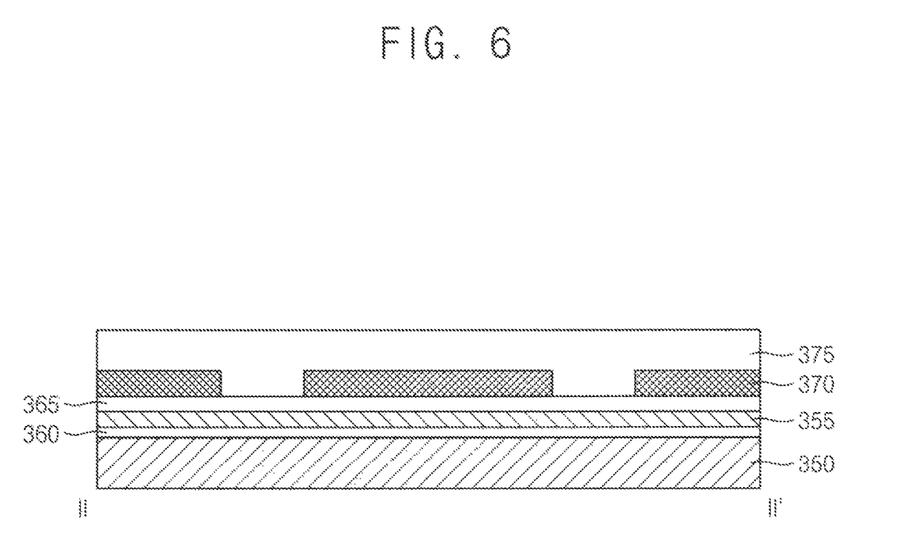
Figure 7:
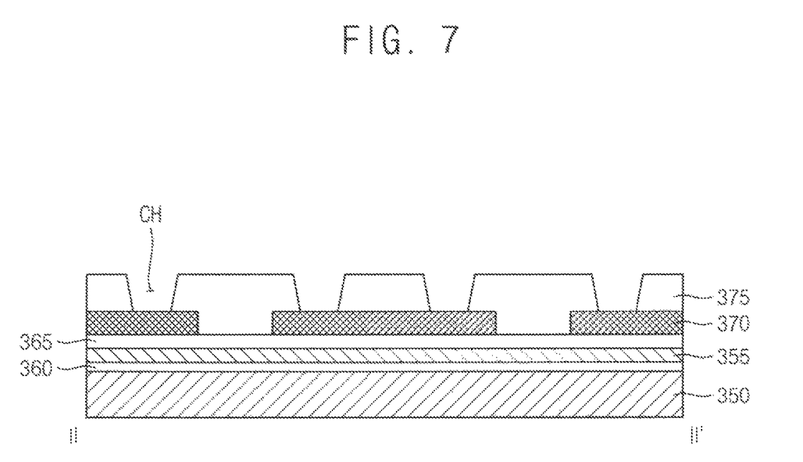

Referring to FIGS. 2 through 4, the first lighting test line 221 (or, the lighting test line) may include N test lines that are disposed in the first layer and N−1 bridges that are disposed in the second layer, where N is an integer greater than or equal to 2. An (i)th bridge among N−1 the bridges may electrically connect an (i)th test line and an (i+1)th test line among the N test lines, where i is a positive integer smaller than n. Here, the (i+1)th test line may be disposed adjacent to the (i)th test line.

As illustrated in FIGS. 3 and 4, the lighting test line may include test lines 370 that are disposed in the first layer, and bridges 380 and 390 that are disposed in the second layer. The bridge 380 may electrically connect a certain test line 370 and another test line that is adjacent to the certain test line 370.

The test lines 370 may have a predetermined length in a certain direction (e.g., in a direction of II-II' axis) and may be repeatedly arranged with some distances along the certain direction. The bridges 380 and 390 may be arranged along the certain direction and may electrically connect the test lines 370.

In exemplary embodiments, the first layer may be the same a layer in which a gate electrode of a transistor is disposed. Here, the transistor may be transistors included in the display panel 100. Therefore, the test lines 370 may be provided at the same time at which the gate electrode of the first test transistor TR1 illustrated in FIG. 2 is provided.

In exemplary embodiments, the test lines 370 may include a material which is the same as a material of the gate electrode of a transistor (e.g., the first test transistor TR1 in FIG. 2). In an exemplary embodiment, the test lines 370 may include metal, alloy, metal nitride, conductive metal oxide, transparent conductive material, and etc., for example. In an exemplary embodiment, the test lines 370 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys of thereof, or a conductive nitride, for example. In an exemplary embodiment, the test lines 370 may include strontium ruthenium oxide ($SrRu_xO_y$), zinc oxide ($ZnO_x$), indium tin oxide ("ITO"), tin oxide ($SnO_x$), indium oxide ($InO_x$), gallium oxide ($GaO_x$), indium zinc and the like oxide ("IZO"), and etc. These may be used alone or in combination with each other, for example.

In exemplary embodiments, the second layer may be the same a layer in which first and second electrodes of the transistor. Therefore, the bridges 380 and 390 may be provided at the same time at which the first and second electrodes (or, a source electrode and a drain electrode) of the transistor. In an exemplary embodiment, the bridges 380 and 390 may be provided at a time at which the first and second electrodes of the first test transistor TR1 illustrated in FIG. 2 are provided.

In exemplary embodiments, the bridges 380 and 390 may include a material which is the same as a material of the gate electrode of the transistor. In an exemplary embodiment, the bridges 380 and 390 may include metal, alloy, metal nitride, conductive metal oxide, transparent conductive material, and etc., for example. In an exemplary embodiment, the test lines 370 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys of thereof, or a conductive nitride, for example. In an exemplary embodiment, the bridges 380 and 390 may include strontium ruthenium oxide (SrRuxOy), zinc oxide (ZnOx), ITO, tin oxide (SnOx), indium oxide (InOx), gallium oxide (GaOx), IZO, and etc., for example. These may be used alone or in combination with each other.

In exemplary embodiments, an insulating interlayer 375 may be disposed between the first layer and the second layer. That is, the non-display region 120 may include the insulating interlayer 375 between the first layer and the second layer. The insulating interlayer 375 may be provided with a single layer structure or may be provided with a multi-layer structure. The insulating interlayer 375 may include an organic material. In an exemplary embodiment, the insulating interlayer 375 may include photo-resist, acrylic resin, polyimide resin, polyamide resin, siloxane-based resin, or the like, for example. These may be used alone or in combination with each other. In an exemplary embodiment, the insulating interlayer 375 may be provided using an inorganic material such as silicon combinations, metals, metal oxides, and etc., for example. In an exemplary embodiment, the insulating interlayer 375 may include silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, and the like, for example. These may be used alone or in combination with each other.

In an example embodiment, the (i)th bridge may be adjacent to a second electrode of the transistor. In an exemplary embodiment, the second bridge 390 may be adjacent to the second electrode of the first test transistor TR1, for example. Here, the test line 370 electrically connected to the second electrode of the first test transistor TR1 may have a minimum length (or, a minimized length). Therefore, an antenna ratio (or, an antenna effect) of the first lighting test line 221 may be minimized.

Similarly, the (i)th bridge may be adjacent to a data line. In an exemplary embodiment, the first bridge 380 may be adjacent to the data line (i.e., a contact point of the data line and the second lighting test line 222), for example. Here, the test line 370 electrically connected to the data line (or, a transistor included in a pixel that is electrically connected to the data line) may have a minimum length. Therefore, an antenna ratio (or, an antenna effect) of the first lighting test line 221 may be minimized.

In exemplary embodiments, the lighting test line may include a first test line that is disposed in the first layer, a first connecting line that is disposed in the second layer, and a first contact that electrically connects the first test line and the first connecting line. In an exemplary embodiment, the first test line may be disposed between an area I (or, a certain point of the area I) and the first transistor, a second test line may be disposed between the area I (or, a certain point of the area I) and the data line, and the second test line may be electrically connected to the first test line through the first contact. As described above, the first layer may be the same as a layer in which the gate electrode of the transistor is disposed, and the second layer may be the same as a layer in which the first and second electrodes (or, a source electrode and a drain electrode) of the transistor are disposed.

Here, the first test line may include a material which is the same as a material of the gate electrode of the transistor, and the first connecting line may include a material which is the same as a material of the first electrode of the transistor. The first contact may include a material which is different from a material of the first electrode of the transistor. That is, the first contact may be provided at a time different from a time at which the first electrode of the transistor is provided.

As described above, the lighting test line (or, the first lighting test line 221) may include the test lines 370 and the bridges 380 and 390 that are provided in mutually different times, and in a certain manufacturing process (e.g., an etching process) of the display panel 110, a length of the first lighting test line 221 that is electrically connected to a transistor (e.g., the test transistor) may be shorter than a lighting test line that is disposed in only one layer. Therefore, the antenna ratio (or, the antenna effect) of the first lighting test line 221 may be reduced.

FIGS. 5 through 8 are cross-sectional views describing a method of forming a lighting test line of a display panel according to exemplary embodiments.

Referring to FIGS. 5 through 8, the method of forming the lighting test line may sequentially form a buffer layer 360, an active pattern 355, and a first insulating layer 365 (or, a gate insulating film) on a substrate 350. In an exemplary embodiment, the substrate 350 may be provided using a transparent polymer resin such as a polyimide-based resin. In an exemplary embodiment, the first insulating layer 365 may be obtained (or, be formed) using (or, by) a chemical vapor deposition process, a spin coating process, a plasma enhanced chemical vapor deposition process, a sputtering process, a vacuum deposition process, a high-density plasma-chemical vapor deposition process, a printing process, and etc., for example.

The method of forming the lighting test line may form the test lines 370 on the first insulating layer 365. In an exemplary embodiment, the method may form a conductive layer on the first insulating layer 365, and the conductive layer may be patterned by an etching process and may be provided as the lighting test lines 370. In an exemplary embodiment, the conductive layer may be provided using a metal, metal nitride or alloy, for example.

The method of forming the lighting test line may form a second insulating layer 375 (or, an insulating interlayer), which covers the test lines 370, on the first insulating layer 365. Similarly as the first insulating layer 365, the second insulating layer 375 may be obtained (or, be formed) using (or, by) a chemical vapor deposition process, a spin coating process, a plasma enhanced chemical vapor deposition process, a sputtering process, a vacuum deposition process, a high-density plasma-chemical vapor deposition process, a printing process, and etc., for example.

The method of forming the lighting test line may provide the bridge 390 on the second insulating layer 375 and may electrically connect the bridge 390 to the test lines 370 through a contact hole CH. In an exemplary embodiment, the contact hole CH, which is contactable to the test lines 370, may be defined in the second insulating later 375, and the bridge 390 may be provided to fully fill the contact hole CH at a later time. In an exemplary embodiment, the contact hole CH may be defined by a photo process using a single etching mask, for example.

Figure 8:
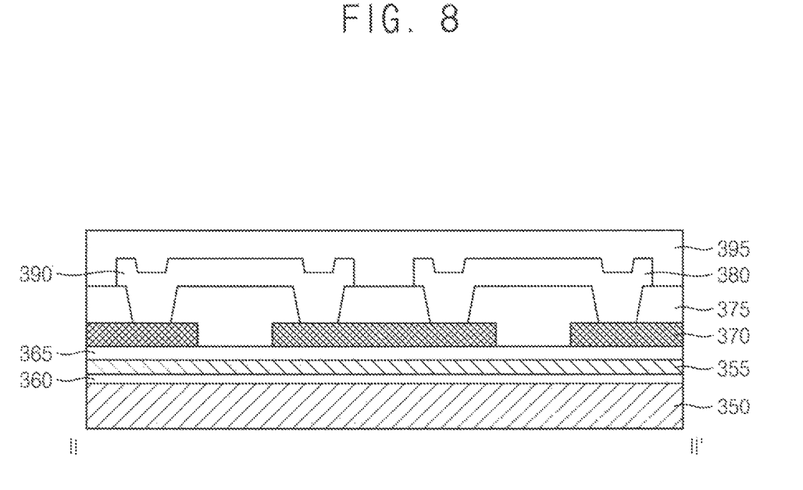

Then, the method of forming the lighting test line may form a via-insulating layer 395 to cover the second insulating layer 375 and the bridge 390. The via-insulating layer 395 may have a top surface which is substantially flat as illustrated in FIG. 8. In an exemplary embodiment, the via-insulating layer 395 may be provided using polyimide, epoxy resin, acrylic resin, using the organic material such as polyester may be provided through by a spin coating process or a slit coating process, for example.

As described above, the method of forming the lighting test line according to exemplary embodiments may pattern the test lines 370 on the substrate 350, may form the second insulating layer 375 (or, an insulating interlayer) to cover the substrate 350 and the test lines 370, may define the contact hole CH in the second insulating layer 375, and may provide the bridge 390 on the second insulating layer 375 to connect the bridge 390 and the test lines 370 through the contact hole CH. Therefore, the method of forming the lighting test line may form the lighting test line effectively.

The invention may be applied to any display device including a display panel. In an exemplary embodiment, the invention may be applied to a computer, a laptop, a cellular phone, a smart phone, a smart pad, a portable multimedia player ("PMP"), a personal digital assistant ("PDA"), an MP3 player, a digital camera, a video camcorder, and etc., for example.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display panel comprising:
   a display region including a data line and a pixel which is electrically connected to the data line;
   a non-display region including a lighting test line which is alternately disposed in a first layer and in a second layer disposed on the first layer along a major longitudinal length defining the lighting test line extending in the non-display region, the non-display region being adjacent to the display region, the lighting test line being extended from the data line and being formed in the non-display region along at least one side of the display region; and
   a lighting test unit which provides a lighting test voltage to the display region through the lighting test line,
   wherein the lighting test line includes:
   a first test line disposed in the first layer;
   a first connecting line disposed in the second layer; and
   a first contact electrically connecting the first test line and the first connecting line,
   wherein the first test line and the first connecting line are repeatedly and alternately disposed with each other along the major longitudinal length defining at least substantially an entirety of the lighting test line extending in the non-display region to reduce an antenna ratio thereof.

2. The display panel of claim 1, wherein the lighting test line includes:
   N test lines disposed in the first layer, where N is an integer greater than or equal to 2; and
   N−1 bridges disposed in the second layer, and
   wherein an (i)th bridge among the N−1 bridges electrically connects an (i)th test line and an (i+1)th test line among the N test lines, where i is a positive integer smaller than N.

3. The display panel of claim 2, wherein the display region includes an insulating interlayer disposed between the first layer and the second layer.

4. The display panel of claim 3, wherein the (i)th bridge is electrically connected to the (i)th test line and the (i+1)th test line through a contact hole defined in the insulating interlayer.

5. The display panel of claim 2, wherein the lighting test unit includes:
   a test transistor including a first electrode which receives the lighting test voltage, a second electrode which is electrically connected to the lighting test line, and a gate electrode which receives a lighting test control signal,
   wherein the gate electrode of the test transistor is disposed in the first layer, and
   wherein the first electrode and the second electrode of the test transistor are disposed in the second layer.

6. The display panel of claim 5, wherein each of the N test lines includes a material which is the same as a material of the gate electrode of the test transistor.

7. The display panel of claim 5, wherein each of the N−1 bridges includes a material which is the same as a material of the first electrode of the test transistor.

8. The display panel of claim 5, wherein the (i)th bridge is adjacent to the second electrode of the test transistor.

9. The display panel of claim 5, wherein the (i)th bridge is adjacent to the data line.

10. The display panel of claim 1, wherein the lighting test unit includes:
    a test transistor including a first electrode which receives the lighting test voltage, a second electrode which is electrically connected to the lighting test line, and a gate electrode which receives a lighting test control signal,
    wherein the gate electrode of the test transistor is disposed in the first layer, and
    wherein the first electrode and the second electrode of the test transistor are disposed in the second layer.

11. The display panel of claim 10, wherein the first connecting line includes a material which is the same as a material of the first electrode of the test transistor.

12. The display panel of claim 10, wherein the first contact includes a material which is different from a material of the first electrode of the test transistor.

13. The display panel of claim 10, wherein the non-display region includes an insulating interlayer disposed between the first layer and the second layer.

14. The display panel of claim 13, wherein the first contact electrically connects the first test line and the first connecting line through a contact hole defined in the insulating interlayer.

15. The display panel of claim 1, wherein the pixel emits green color light in response to the lighting test voltage.

16. The display panel of claim 15, wherein the data line extends in a first direction and the data line is disposed in an edge of the display region in a second direction, and
wherein the second direction is perpendicular to the first direction.

17. The display panel of claim 1, further comprising:
a pad unit electrically connected to a driving integrated circuit; and
a switching unit which is electrically connected between the pad unit and the data line and which receives a reference voltage from the driving integrated circuit and transfers the reference voltage to the data line.

18. The display panel of claim 17, wherein the driving integrated circuit controls the lighting test unit and the switching unit to alternatively provide the lighting test voltage and the reference voltage to the data line.

19. A display panel comprising:
a substrate including a display region and a non-display region which is adjacent to the display region;
a pixel electrically connected to a data line and a scan line, the pixel being included in the display region; and
a lighting test line extended from the data line, the lighting test line being formed in the non-display region along at least one side of the display region,
wherein the lighting test line includes a plurality of test lines which are apart from each other and at least one bridge structure which connects adjacent ones of the test lines, and
wherein the plurality of test lines which are apart from each other are repeatedly and alternately disposed with each other along a major longitudinal length defining at least a substantial length of an entirety of the lighting test line extending in the non-display region to reduce an antenna ratio thereof.

* * * * *